United States Patent
Minami et al.

(10) Patent No.: US 8,900,473 B2
(45) Date of Patent: Dec. 2, 2014

(54) POLISHING SOLUTION FOR CMP, AND METHOD FOR POLISHING SUBSTRATE USING THE POLISHING SOLUTION FOR CMP

(75) Inventors: Hisataka Minami, Hitachi (JP); Ryouta Saisyo, Hitachi (JP); Hiroshi Ono, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 95 days.

(21) Appl. No.: 12/737,650

(22) PCT Filed: Jul. 23, 2009

(86) PCT No.: PCT/JP2009/063172
§ 371 (c)(1),
(2), (4) Date: Mar. 1, 2011

(87) PCT Pub. No.: WO2010/016390
PCT Pub. Date: Feb. 11, 2010

(65) Prior Publication Data
US 2011/0177690 A1  Jul. 21, 2011

(30) Foreign Application Priority Data

Aug. 6, 2008  (JP) ................................ P2008-202937
Nov. 20, 2008  (JP) ................................ P2008-297285

(51) Int. Cl.
*C03C 15/00* (2006.01)
*C03C 25/68* (2006.01)
(Continued)

(52) U.S. Cl.
CPC ............. *C09K 3/1463* (2013.01); *B24B 37/044* (2013.01); *C09G 1/02* (2013.01); *H01L*
(Continued)

(58) Field of Classification Search
USPC ................................ 216/88–91; 438/690–693
See application file for complete search history.

(56) References Cited

U.S. PATENT DOCUMENTS 4,944,836 A  7/1990  Beyer et al.
6,527,622 B1  3/2003  Brusic et al.
(Continued)

FOREIGN PATENT DOCUMENTS

CN  1835212  3/2006
CN  1813038  8/2006
(Continued)

OTHER PUBLICATIONS

F.B. Kaufman et al., "Chemical-Mechanical Polishing for Fabricating Patterned W Metal Features as Chip Interconnects", J. Electrochem Soc., vol. 138, No. 11, Nov. 1991, pp. 3460-3464.
(Continued)

*Primary Examiner* — Allan Olsen
*Assistant Examiner* — Margaret D Klunk
(74) *Attorney, Agent, or Firm* — Antonelli, Terry, Stout & Kraus, LLP.

(57) ABSTRACT

The CMP polishing liquid of the present invention contains 1,2,4-triazole, a phosphoric acid, an oxidant, and abrasive particles. The polishing method of the present invention is a substrate polishing method for polishing a substrate with a polishing cloth while supplying a CMP polishing liquid between the substrate and the polishing cloth, in which the substrate is a substrate having a palladium layer, and the CMP polishing liquid is a CMP polishing liquid containing 1,2,4-triazole, a phosphoric acid, an oxidant, and abrasive particles.

9 Claims, 4 Drawing Sheets

(a)

(b)

(51) Int. Cl.
*H01L 21/302* (2006.01)
*H01L 21/461* (2006.01)
*C09K 3/14* (2006.01)
*B24B 37/04* (2012.01)
*C09G 1/02* (2006.01)
*H01L 21/321* (2006.01)
*H01L 23/00* (2006.01)
*H01L 29/06* (2006.01)

(52) U.S. Cl.
CPC .... 21/3212 (2013.01); *H01L 24/03* (2013.01); *H01L 24/11* (2013.01); *H01L 29/0657* (2013.01); *H01L 24/05* (2013.01); *H01L 24/13* (2013.01); *H01L 2224/03616* (2013.01); *H01L 2224/05026* (2013.01); *H01L 2224/05073* (2013.01); *H01L 2224/05082* (2013.01); *H01L 2224/051* (2013.01); *H01L 2224/05155* (2013.01); *H01L 2224/05571* (2013.01); *H01L 2224/05664* (2013.01); *H01L 2224/11462* (2013.01); *H01L 2224/13022* (2013.01); *H01L 2224/131* (2013.01); *H01L 2224/13139* (2013.01); *H01L 2224/13144* (2013.01); *H01L 2224/13147* (2013.01); *H01L 2224/13155* (2013.01); *H01L 2224/94* (2013.01); *H01L 2924/01004* (2013.01); *H01L 2924/01012* (2013.01); *H01L 2924/01013* (2013.01); *H01L 2924/0102* (2013.01); *H01L 2924/01025* (2013.01); *H01L 2924/01029* (2013.01); *H01L 2924/0103* (2013.01); *H01L 2924/01033* (2013.01); *H01L 2924/01038* (2013.01); *H01L 2924/01046* (2013.01); *H01L 2924/01047* (2013.01); *H01L 2924/01056* (2013.01); *H01L 2924/01057* (2013.01); *H01L 2924/01073* (2013.01); *H01L 2924/01078* (2013.01); *H01L 2924/01079* (2013.01); *H01L 2924/014* (2013.01); *H01L 2924/04941* (2013.01); *H01L 2924/14* (2013.01); *H01L 2924/3025* (2013.01); *H01L 2924/01005* (2013.01); *H01L 2924/01006* (2013.01); *H01L 2924/01019* (2013.01); *H01L 2924/01023* (2013.01); *H01L 2924/01024* (2013.01); *H01L 2924/01037* (2013.01); *H01L 2924/0104* (2013.01); *H01L 2924/01044* (2013.01); *H01L 2924/0105* (2013.01); *H01L 2924/01055* (2013.01); *H01L 2924/01074* (2013.01)

USPC .......... 216/88; 216/89; 216/90; 216/91; 438/690; 438/691; 438/692; 438/693

(56) References Cited

U.S. PATENT DOCUMENTS

| | | |
|---|---|---|
| 6,599,837 B1 * | 7/2003 | Merchant et al. ............ 438/692 |
| 6,971,945 B2 * | 12/2005 | Liu et al. ........................ 451/41 |
| 8,101,864 B2 | 1/2012 | Chinda et al. |
| 2004/0266196 A1 * | 12/2004 | De Rege Thesauro et al. .............................. 438/698 |
| 2005/0076580 A1 * | 4/2005 | Tamboli et al. ................. 51/307 |
| 2005/0211950 A1 * | 9/2005 | de Rege Thesauro et al. ............................ 252/79.1 |
| 2006/0030158 A1 * | 2/2006 | Carter et al. ................... 438/692 |
| 2006/0099817 A1 * | 5/2006 | Feller et al. .................... 438/745 |
| 2006/0225918 A1 | 10/2006 | Chinda et al. |
| 2006/0251800 A1 * | 11/2006 | Weidman et al. ............ 427/99.5 |
| 2008/0038995 A1 * | 2/2008 | Small et al. ..................... 451/37 |
| 2008/0201943 A1 | 8/2008 | Chinda et al. |
| 2009/0318063 A1 * | 12/2009 | Misra ............................... 451/28 |
| 2010/0087065 A1 * | 4/2010 | Boggs et al. .................. 438/692 |
| 2012/0100718 A1 * | 4/2012 | Minami et al. ................ 438/693 |
| 2012/0238094 A1 * | 9/2012 | Minami et al. ................ 438/693 |

FOREIGN PATENT DOCUMENTS

| | | |
|---|---|---|
| JP | 3192968 | 2/1997 |
| JP | 11-121411 | 4/1999 |
| JP | 3780767 | 3/2001 |
| JP | 2005-117046 | 4/2005 |
| JP | 2006-295114 | 10/2006 |
| JP | 2006295114 A * | 10/2006 |
| JP | 2006-297501 A2 | 11/2006 |
| JP | 2007-526626 | 9/2007 |
| JP | 2008-34818 | 2/2008 |
| WO | WO 01/44396 A1 | 6/2001 |
| WO | WO 2010/016390 A1 | 2/2010 |

OTHER PUBLICATIONS

International Search Report for PCT/JP2009/063172, dated Oct. 27, 2009.

Office Action dated Feb. 22, 2012, in counterpart Chinese Application No. 200980130440.6.

International Preliminary Report on Patentability, including the Written Opinion, issued by the International Bureau of WIPO on Mar. 8, 2011 for International Application No. PCT/JP2009/063172 (5 pages).

* cited by examiner

POLISHING SOLUTION FOR CMP, AND METHOD FOR POLISHING SUBSTRATE USING THE POLISHING SOLUTION FOR CMP

TECHNICAL FIELD

The present invention relates to a CMP polishing liquid and a method for polishing a substrate using the CMP polishing liquid.

BACKGROUND ART

In recent years, along with the high integration and the enhancement of performance of the semiconductor integrated circuit (LSI), a novel microfabrication technology has been developed. A chemical mechanical polishing (CMP) method is one of them and becomes a technology frequently utilized in an LSI production step, particularly planarization of an interlayer insulating film layer, metal plug formation, and trench formation in a multilayer wiring forming step (for example, see Patent Literature 1).

A polishing liquid for a metal used for CMP has generally an oxidant and a solid abrasive particle and if necessary, thereto, further a metal oxide dissolving agent and a protective film forming agent (metal anticorrosive) are added. A fundamental mechanism of polishing is considered to comprise first, oxidizing a metal layer surface by an oxidant and then removing the resultant oxidized layer by a solid abrasive particle.

An oxidized layer in the metal layer surface deposited on a groove (concavity) is not so much contacted with a polishing pad, so that the effect of scraping by a solid abrasive particle does not extend thereto. However, in an oxidized layer in the metal layer surface deposited on a convexity and contacted with a polishing pad, scraping is progressed. Accordingly, along with a progress in CMP, a metal layer on the convexity is removed and the surface of the substrate is planarized (for example, see Non Patent Literature 1).

On the other hand, along with the high integration of a semiconductor device, an increase in the number of pins, narrowing of the pitch, and thin implementation are required. Further, the prevention of a wiring delay between a semiconductor device and a wiring substrate and a noise has become also an important task. Therefore, as the bonding between the semiconductor device and the wiring substrate, instead of a conventional mounting predominantly of wire bonding, a flip-chip mounting has been widely adopted.

Then, in this flip-chip mounting, there is widely used a solder bump bonding method in which a convex electrode is formed on an electrode terminal of a semiconductor device and through this convex electrode, all bondings are collectively performed to a bonding terminal formed on the wiring substrate.

As the CMP polishing liquid aiming at a layer composed of titanium nitride or tantalum nitride, etc. and formed on a substrate as a polishing object, there is known a polishing liquid in which a protective film forming agent and an organic acid are added (see Patent Literature 2).

In addition, as an attempt to apply CMP to a layer composed of copper, there is known a method using, for example, a polishing liquid in which 2-quinolinecarboxylic acid is added (see Patent Literature 3). In addition, as an attempt to apply CMP to a nickel layer, there is known a method using, for example, a polishing liquid in which abrasive particles, an organic acid, and an oxidant are added as a polishing liquid for an HDD magnetic head (see Patent Literature 4).

Here, palladium is generally classified together with platinum, ruthenium, etc. into "noble metal". As an attempt to apply CMP to such a noble metal layer, there is known a method using, for example, a polishing liquid in which a sulfur compound is added, a polishing liquid in which any one of a diketone, a nitrogen-containing heterocyclic compound, or an amphoteric ion compound is added, or a polishing liquid in which an oxide of a metal belonging to the Platinum Group is added (see Patent Literatures 5, 6, and 7).

CITATION LIST

Patent Literature

Patent Literature 1: U.S. Pat. No. 4,944,836
Patent Literature 2: Japanese Patent No. 3780767
Patent Literature 3: Japanese Patent No. 3192968
Patent Literature 4: Japanese Patent Application Laid-Open Publication No. 2006-297501
Patent Literature 5: International Publication No. WO 01/44396 Pamphlet
Patent Literature 6: U.S. Pat. No. 6,527,622
Patent Literature 7: Japanese Patent Application Laid-Open Publication No. 11-121411

Non Patent Literature

Non Patent Literature 1: Journal of Electrochemical Society, Vol. 138, No. 11 (published in 1991), pp. 3460 to 3464

SUMMARY OF INVENTION

Technical Problem

However, hitherto, a study for polishing palladium by CMP has not been performed. According to the findings of the present inventors, the polishing liquids of Patent Literatures 2, 3, and 4 mentioned above cannot polish palladium that is hardly oxidized and has a high hardness. In addition, though it is mentioned that the polishing liquids of Patent Literatures 5, 6, and 7 mentioned above can polish platinum and ruthenium, it was found that even when palladium is polished with the same polishing liquids, polishing does not progress.

Thus, it is an object of the present invention to provide a CMP polishing liquid capable of enhancing a polishing rate of at least a palladium layer higher than that in the case of using a conventional polishing liquid, and a polishing method using the CMP polishing liquid.

Solution to Problem

The present invention provides a CMP polishing liquid comprising 1,2,4-triazole, a phosphoric acid, an oxidant, and an abrasive particle.

By the CMP polishing liquid of the present invention, the polishing rate of at least a palladium layer can be increased as compared with that in the case of using a conventional polishing liquid and polishing can be performed at a desired polishing rate.

As the oxidant, at least one oxidant selected from the group consisting of hydrogen peroxide, periodic acid, a periodate, an iodate, a bromate, and a persulfate is preferred. As the abrasive particle, at least one selected from the group consisting of alumina, silica, zirconia, titania, and ceria is preferred.

The concentration of the abrasive particle is preferably 0.1 to 10% by mass, based on the total mass of the CMP polishing liquid. By setting the concentration of the abrasive particle in the CMP polishing liquid in this range, the scraping action can be maintained and simultaneously aggregation and precipitation of the particles can be suppressed.

The above-described CMP polishing liquid is useful particularly as a CMP polishing liquid for polishing palladium.

The present invention provides a substrate polishing method for polishing a substrate with a polishing cloth while supplying a CMP polishing liquid between the substrate and the polishing cloth, in which the substrate is a substrate having a palladium layer, and the CMP polishing liquid is a CMP polishing liquid comprising 1,2,4-triazole, a phosphoric acid, an oxidant, and an abrasive particle.

Advantageous Effects of Invention

By the CMP polishing liquid of the present invention and the polishing method using the CMP polishing liquid, the polishing rate of at least a palladium layer can be increased as compared with that in the case of using a conventional polishing liquid, and polishing can be performed at a desired polishing rate.

DESCRIPTION OF EMBODIMENTS

Hereinafter, the best modes for carrying out the present invention will be described in detail.

(1,2,4-Triazole)

The CMP polishing liquid contains 1,2,4-triazole. 1,2,4-triazole is considered to form together with phosphoric acid described below a complex with palladium, and the resultant formed complex is easily polished, so that it is estimated that an advantageous polishing rate can be obtained. In addition, though it is considered that a nitrogen-containing compound can form a complex with palladium, it is apparent according to the study of the present inventors that a compound except 1,2,4-triazole cannot increase the polishing rate for a palladium layer. For example, by 1,2,3-triazole or 3-amino-1,2,4-triazole having a structure similar to that of 1,2,4-triazole, it is difficult to obtain an advantageous polishing rate for a palladium layer.

The additive amount of 1,2,4-triazole is preferably 0.001 to 20% by mass, based on the total mass of the polishing liquid. When the content is 0.001% by mass or more, there is a tendency that the polishing rate of a palladium layer by CMP becomes higher, and the lower limit value is more preferably 0.01% by mass or more, particularly preferably 0.05% by mass or more. On the contrary, when the content is more than 20% by mass, there is a tendency that the polishing rate of a palladium layer is saturated, and the upper limit value is more preferably 15% by mass or less, further preferably 12% by mass or less, particularly preferably 10% by mass or less.

(Phosphoric Acids)

The CMP polishing liquid contains a phosphoric acid. Phosphoric acids are considered to complex and/or dissolve a metal oxidized by an oxidant described below to accelerate polishing of a metal film and are estimated to have a function as a metal oxide dissolving agent for palladium.

Though various inorganic acids, organic acids, and the like can be considered as the compound having a function as a metal oxide dissolving agent for palladium according to the study of the present inventors, it is difficult to obtain an advantageous polishing rate for palladium with an acid except phosphoric acids.

Phosphoric acids represent phosphoric acid and a group of other similar compounds having a phosphoric acid skeleton (phosphoric acid, phosphoric acid derivatives, pyrophosphoric acid, pyrophosphoric acid derivatives, polyphosphoric acid, polyphosphoric acid derivatives, and the like) and include salts thereof. Specific examples of the phosphoric acids include phosphoric acid, hypophosphoric acid, phosphorous acid, hypophosphorous acid, pyrophosphoric acid, trimetaphosphoric acid, tetrametaphosphoric acid, pyrophosphorous acid, and polyphosphoric acid. In addition, examples of the salt of phosphoric acids include salts of anions of phosphoric acids with cations. Examples of the cation include ions of lithium, sodium, potassium, rubidium, cesium, beryllium, magnesium, calcium, strontium, barium, titanium, zirconium, vanadium, chromium, manganese, iron, cobalt, nickel, copper, silver, palladium, zinc, aluminum, gallium, tin, and ammonium. As the salt, there may be any one of a monobasic salt having one metal atom and two hydrogen atoms, a dibasic salt having two metal atoms and one hydrogen atom, and a tribasic salt having three metal atoms, and may be any one of an acidic salt, an alkaline salt, and a neutral salt. These phosphoric acids may be used alone or in combination of two or more types thereof.

The additive amount of the above-described phosphoric acids is preferably 0.001 to 20% by mass, based on the total mass of the polishing liquid. When the content is 0.001% by mass or more, there is a tendency that the polishing rate of a palladium layer by CMP becomes higher, and the lower limit value is more preferably 0.01% by mass or more, particularly preferably 0.02% by mass or more. On the contrary, when the content is more than 20% by mass, there is a tendency that the polishing rate of a palladium layer is saturated, and the upper limit value is more preferably 15% by mass or less, particularly preferably 10% by mass or less. In addition, also when a substrate having besides the palladium layer described below, a nickel layer, a underlying metal layer, or the like is polished, the additive amount of the phosphoric acids is preferably the above-described additive amount.

(Oxidant)

The oxidant contained in the CMP polishing liquid is an oxidant for a metal used for a substrate as for forming a layer or the like. Examples of the oxidant include hydrogen peroxide ($H_2O_2$), periodic acid, a periodate, an iodate, a bromate, and a persulfate and among them, particularly preferred is hydrogen peroxide. These oxidants may be used alone or in combination of two or more types thereof.

The additive amount of the oxidant is preferably 0.05 to 20% by mass, more preferably 0.1 to 15% by mass, particularly preferably 0.1 to 10% by mass, based on the total mass of the polishing liquid. When this blending amount is 0.05% by mass or more, the oxidation of a metal is satisfactory and there is a tendency that the polishing rate of a palladium layer becomes higher. When the blending amount is 20% by mass or less, there is a tendency that a roughness on the polished surface is hardly caused. Here, hydrogen peroxide is usually available as hydrogen peroxide water. Accordingly, when hydrogen peroxide is used as the oxidant, hydrogen peroxide water should be added in an additive amount converted from the above-described content as a net concentration of hydrogen peroxide. In addition, also when a substrate having, besides the palladium layer described below, a nickel layer, a underlying metal layer, or the like is polished, the additive amount of the oxidant is preferably the above-described additive amount.

(Abrasive Particle)

Specific examples of the abrasive particle include fumed alumina, transition alumina, fumed silica, colloidal silica, zirconia, titania, and ceria and among them, preferred are fumed alumina, transition alumina, fumed silica, and colloidal silica, further preferred is colloidal silica in that while maintaining the polishing rate high, a polishing scratch can be suppressed.

The additive amount of the abrasive particle is preferably 0.1% by mass to 10% by mass, more preferably in a range of 0.2% by mass to 8.0% by mass, based on the total mass of the polishing liquid. When this additive amount is 0.1% by mass or more, a mechanical polishing action can be obtained and there is a tendency that the polishing rate of a palladium layer by CMP becomes higher. In addition, when the additive amount is 10% by mass or less, there is a tendency that aggregation and precipitation of particles can be suppressed. In addition, even when an amount of more than 10% by mass is added, there is a tendency that an increase in the polishing rate corresponding to the added amount is not observed. Such a tendency is a tendency remarkably observed corresponding to the polishing rate of a palladium layer.

The primary particle diameter of the abrasive particle is, in terms of planarity and capability of suppressing a scratch remaining on the polished surface after polishing, preferably 300 nm or less, more preferably 200 nm or less, particularly preferably 150 nm or less, extremely preferably 100 nm or less. In addition, though the lower limit of the primary particle diameter is not particularly limited, the lower limit is more preferably 1 nm or more, particularly preferably 3 nm or more, extremely preferably 5 nm or more because a satisfactory mechanical scraping action can be obtained.

Here, the primary particle diameter is referred to as "average primary particle diameter" an average diameter of particles that can be calculated from a BET specific surface area. It is specifically described as follows. First, abrasive particles are dried at 800° C. (±10° C.) for 1 hour to obtain an ignition residue. Next, this ignition residue is finely ground by a mortar (porcelain, 100 ml) to prepare a sample for the measurement. Then, using a BET specific surface area measuring apparatus (for example, manufactured by Yuasa Ionics Inc., trade name: Autosorb 6), a BET specific surface area V (unit: $nm^2/g$) of the sample for the measurement is measured and a value D (nm) obtained by the formula: $D=6/(\rho \cdot V)$ is calculated as an average primary particle diameter. Here, $\rho$ in the above formula represents a density (unit: $g/nm^3$) of a particle and when the particle is colloidal silica, "$\rho=0.022$".

The average secondary particle diameter of the abrasive particle is preferably 5 to 500 nm. In terms of improved planarity, the upper limit value of the average secondary particle diameter is preferably 300 nm or less, more preferably 200 nm or less, particularly preferably 100 nm or less. In addition, in terms that a mechanical reacting-layer (oxidized layer) removing capability by polishing particles can be secured to enhance the polishing rate, the lower limit value of the average secondary particle diameter is more preferably 5 nm or more, particularly preferably 10 nm or more.

The primary particle diameter of the polishing particles in the CMP polishing liquid can be measured using a transmission electron microscope (for example S 4700 manufactured by Hitachi, Ltd.).

A specific measuring method is, for example, as follows. Composite particles containing the above-described two types of inorganic abrasive particles are mixed with other components to prepare a polishing liquid and a proper amount of the polishing liquid is sampled. The sampling amount is determined in consideration of the abrasive particle concentration and, for example, when the abrasive particle concentration is 1% by mass, around 0.2 cc is sampled. The sampled polishing liquid is dried and observed.

In addition, the above-described average secondary particle diameter of the polishing particle is referred to as the secondary particle diameter of the polishing particle in the CMP polishing liquid and can be measured using, for example a light diffraction/scattering particle size distribution meter (for example, COULTER N4SD manufactured by COULTER Electronics Ltd.).

(Metal Anticorrosive)

To the CMP polishing liquid, further a metal anticorrosive may be added. The metal anticorrosive is a compound for inhibiting etching of a metal layer to enhance dishing properties.

Specific examples of the metal anticorrosive include an imine, an azole, a mercaptan, and polysaccharides and among them, from the viewpoint of achieving the suppression of the etching rate of a metal layer together with the polishing rate of a metal layer, a nitrogen-containing cyclic compound is preferred. These metal anticorrosives may be used alone or in combination of two or more types thereof.

Specific examples of the imine include dithizone, cuproin (2,2'-biquinoline), neocuproin (2,9-dimethyl-1,10-phenanthroline), vasocuproin (2,9-dimethyl-4,7-diphenyl-1,10-phenanthroline), and cuperazone (biscyclohexanone-oxalylhydrazone).

Specific examples of the azole include benzimidazole-2-thiol, triazinedithiol, triazinetrithiol, 2[2-(benzothiazolyl)]thiopropionic acid, 2-[2-(benzothiazolyl)]thiobutyric acid; 2-mercaptobenzothiazole, 1,2,3-triazole, 2-amino-1H-1,2,4-triazole, 3-amino-1H-1,2,4-triazole, 3,5-diamino-1H-1,2,4-triazole, benzotriazole, 1-hydroxybenzotriazole, 1-dihydroxypropylbenzotriazole, 2,3-dicarboxypropylbenzotriazole, 4-hydroxybenzotriazole, 4-carboxyl-1H-benzotriazole, 4-carboxyl-1H-benzotriazole methyl ester, 4-carboxyl-1H-benzotriazole butyl ester, 4-carboxyl-1H-benzotriazole octyl ester, 5-hexylbenzotriazole, [1,2,3-benzotriazolyl-1-methyl][1,2,4-triazolyl-1-methyl][2-ethylhexyl]amine, tolyltriazole, naphthotriazole, bis[(1-benzotriazolyl)methyl]phosphonic acid, tetrazole, 5-amino-tetrazole, 5-methyl-tetrazole, 1-methyl-5-mercaptotetrazole, and 1-N,N-dimethylaminoethyl-5-tetrazole.

Specific examples of the mercaptan include nonylmercaptan and dodecylmercaptan.

Specific examples of the polysaccharide include glucose and cellulose.

When the metal anticorrosive is added, the blending amount thereof is preferably in the range by which the polishing rate enhancing effect by 1,2,4-triazole and phosphoric acid is not impaired and in terms that the etching suppressing function and the polishing rate are achieved together, and the blending amount is preferably 0.005 to 2.0% by mass, based on the total mass of the polishing liquid. In terms that higher etching performance can be obtained, the blending amount is more preferably 0.01% by mass or more, further preferably 0.02% by mass or more. In addition, in terms that a preferred polishing rate can be easily obtained, the blending amount is more preferably 1.0% by mass or less, particularly preferably 0.5% by mass or less.

(Water-soluble Polymer)

To the CMP polishing liquid, in terms that planarity after polishing can be enhanced, a water-soluble polymer may be added. From the above-described viewpoint, the weight average molecular weight of the water-soluble polymer is preferably 500 or more, more preferably 1,500 or more, particularly preferably 5,000 or more. Though the upper limit of the weight average molecular weight is not particularly defined, the upper limit is preferably 5,000,000 or less from the viewpoint of the solubility. When the weight average molecular weight is less than 500, there is a tendency that a high polishing rate is not developed.

Here, the weight average molecular weight can be measured by a gel permeation chromatography (GPC) using a calibration curve of the standard polystyrene, and more specifically can be measured under the following conditions.

Used instrument: Hitachi L-6000 type (manufactured by Hitachi, Ltd.) Column: Gel Pack GL-R420+Gel Pack GL-R430+Gel Pack GL-R440 [Hitachi Chemical Co., Ltd., trade name, total 3 pieces]
Eluent: tetrahydrofuran
Measuring temperature: 40° C.
Flow rate: 1.75 ml/min.
Detector: L-3300 R1 [manufactured by Hitachi, Ltd.]

The water-soluble polymer having a weight average molecular weight of 500 or more is not particularly limited so long as the solubility of the components of the polishing liquid is not lowered and the abrasive particles are not agglomerated, and specific examples thereof include polysaccharides, polycarboxylic acid based compounds, vinyl polymers, and glycol compounds. These polymers may be used alone or in combination of two or more types thereof. Examples of the polycarboxylic acid based compound include a polycarboxylic acid or salts thereof and a polycarboxylic acid ester or salts thereof.

Specific examples of the polysaccharides used as the water-soluble polymer include alginic acid, pectic acid, carboxymethylcellulose, agar, curdlan, and pullulan. In addition, specific examples of the polycarboxylic acid based compound used as the water-soluble polymer include, for example, polycarboxylic acids, polycarboxylic acid esters, and salts thereof such as polyaspartic acid, polyglutamic acid, polylysine, polymalic acid, polymethacrylic acid, polymethacrylic acid ammonium salt, polymethacrylic acid sodium salt, polyamic acid, polymaleic acid, polyitaconic acid, polyfumaric acid, poly(p-styrenecarboxylic acid), polyacrylic acid, polyacrylamide, aminopolyacrylamide, polyacrylic acid ammonium salt, polyacrylic acid sodium salt, polyamic acid, polyamic acid ammonium salt, polyamic acid sodium salt, and polyglyoxylic acid; and copolymers thereof.

Further, specific examples of the vinyl polymer used as the water-soluble polymer include polyvinyl alcohol, polyvinylpyrrolidone, and polyacrolein. In addition, polyethylene glycol or the like may be also used.

When the above-described water-soluble polymer compound is used and a substrate to which the water-soluble polymer compound is applied is a silicon substrate for a semiconductor integrated circuit or the like, a contamination by an alkali metal, an alkaline earth metal, a halide, or the like is undesirable, so that the water-soluble polymer compound is desirably an acid or an ammonium salt thereof.

Among the above-described water-soluble polymer compounds, in terms that highly planarizing can be achieved, preferred are: pullulan, polymalic acid, polymethacrylic acid, polyacrylic acid, polyacrylamide, polyvinyl alcohol, and polyvinylpyrrolidone; esters thereof; and ammonium salts thereof.

(pH)

pH of the CMP polishing liquid is, from the viewpoint that the CMP polishing rate of a palladium layer becomes higher, preferably 1 to 12. When pH is 1 or more or pH is 6 or less, there is a tendency that a predetermined polishing rate by CMP can be secured, and such a polishing liquid can become a practical polishing liquid. pH is more preferably 1 to 5, particularly preferably 1 to 4.

(Polishing Method)

By using the above-described CMP polishing liquid, polishing of a substrate becomes possible. In other words, there is provided a substrate polishing method for polishing a substrate with a polishing cloth while supplying the CMP polishing liquid containing 1,2,4-triazole, a phosphoric acid, an oxidant, and abrasive particles between a substrate having a palladium layer and a polishing cloth.

For applying this polishing method, it is preferred that while pressing a face to be polished of a substrate against a polishing cloth of a polishing board and supplying the CMP polishing liquid of the present invention between the face to be polished and the polishing cloth, in a state in which a predetermined pressure is applied to a back face (a face opposite to the face to be polished) of the substrate, the substrate is relatively moved relative to the polishing board to polish the face to be polished.

As the polishing apparatus, there can be used, for example a general polishing apparatus equipped with a motor of which rotation number is variable or the like and having a board to which a polishing cloth (pad) can be adhered and a holder for holding a substrate. As the polishing cloth, a general nonwoven cloth, a foamed polyurethane, a porous fluororesin, and the like can be used. As the polishing condition, for preventing the pop-out of the substrate, it is preferred that the rotation rate of the board is suppressed to a low rotation rate of 200 rpm or less.

The pressure (polishing pressure) applied to the substrate pressed against the polishing cloth is preferably 4 to 100 kPa and from the viewpoint of uniformity within the substrate surface and planarity of a pattern, the pressure is more preferably 6 to 50 kPa. By using the CMP polishing liquid of the present invention, a palladium layer can be polished under a low polishing pressure at a high polishing rate. It is important from the viewpoint of preventing peeling, chipping, fragmentation, cracking, and the like of the layer to be polished and planarity of a pattern that polishing can be performed under a low polishing pressure.

During polishing, the CMP polishing liquid is continuously supplied to the polishing cloth via a pump or the like. The supplying amount thereof is preferably an amount enough for constantly covering the surface of the polishing cloth with the polishing liquid. It is preferred that the substrate after the completion of polishing is well-washed in running water and after water drops attached onto the substrate are swept away using a spin-drier or the like, the substrate is dried.

A substrate to which the largest effect of the CMP polishing liquid is exerted is a substrate having a palladium layer (referred to as a layer containing palladium). The CMP polishing liquid is preferred also for a substrate in which on a semiconductor wafer such as silicon, at least an insulating film layer, a nickel layer (referred to as a" layer containing nickel), and a palladium layer are formed in this order. Here, between the insulating film layer and the nickel layer, a underlying metal layer may be formed.

Examples of the material forming a palladium layer include at least one selected from palladium, palladium alloys, and other palladium compounds.

Examples of the material forming a nickel layer include at least one selected from nickel, nickel alloys, and other nickel compounds.

The underlying metal layer is a layer for preventing the diffusion of a conductive substance to an interlayer insulating film. Examples of the material forming the underlying metal layer include: tantalum compounds such as tantalum, tantalum alloys, and tantalum nitride; titanium compounds such as titanium, titanium alloys, and titanium nitride; tungsten compounds such as tungsten, tungsten nitride, and tungsten alloys.

Examples of the insulating film layer include an inorganic insulating film such as an $SiO_2$ film and an SiN film, and a Low-k film such as an organosilicate glass and an all aromatic ring based Low-k film.

Figure 1:
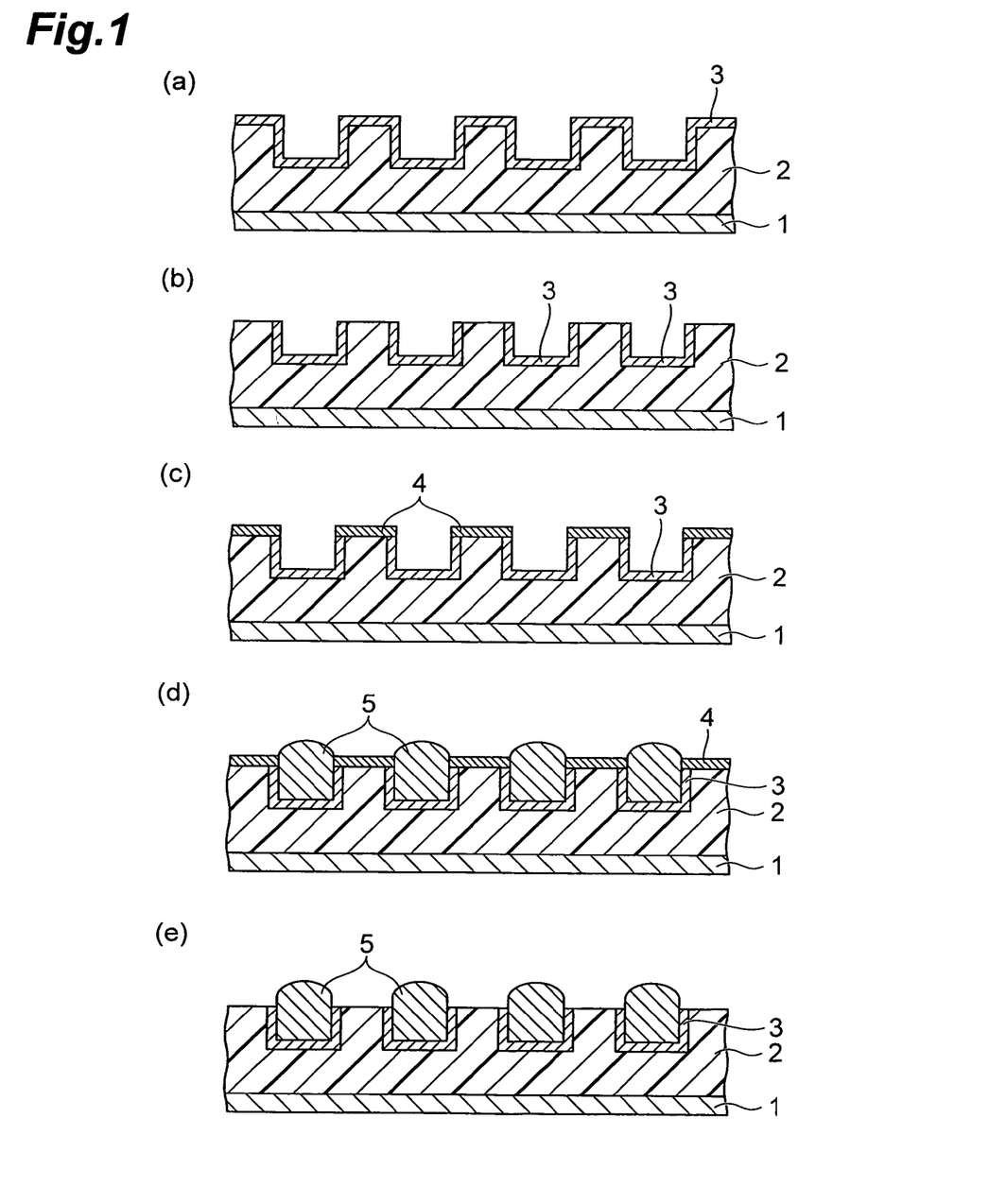
FIG. 1 is a cross sectional view showing a first embodiment of a production method of a substrate having a convex electrode.

Hereinafter, the polishing method using the CMP polishing liquid will be described referring to figures. FIG. 1 is a cross sectional view showing a first embodiment of a production method of a substrate having a convex electrode, and to a part of a step of this production method, the above-described polishing method is applied.

The substrate shown in FIG. 1 (*a*) contains a silicon wafer 1, an insulating film 2 having a concavity-convexity formed on the silicon wafer 1, and an under barrier metal layer 3 coating the concavity-convexity surface of the insulating film 2. Here, the under barrier metal layer 3 corresponds to a palladium layer. The under barrier metal layer 3 of such a substrate is polished using the CMP polishing liquid of the present invention. In other words, while supplying the CMP polishing liquid containing 1,2,4-triazole, a phosphoric acid, an oxidant, and abrasive particles between the under barrier metal layer 3 and a polishing cloth; the substrate is polished with a polishing cloth to expose a convexity of the insulating film 2.

By such a polishing, the under barrier metal layer 3 formed on the convexity of the insulating film 2 is removed. FIG. 1 (*b*) is a cross sectional view showing the substrate obtained by such a polishing.

Next, on the convexity of the insulating film 2 from which the under barrier metal layer 3 has been removed, a resist pattern 4 is formed by a publicly-known method so that the under barrier metal layer 3 formed on the concavity of the insulating film 2 is exposed. FIG. 1 (*c*) is a cross sectional view showing the substrate in which the resist pattern 4 is formed.

Next, by a method such as an electro-plating method, in the concavity of the substrate on which the resist pattern 4 is formed, a convex electrode 5 is formed to project the convex electrode 5 from the surface of the insulating film 2. FIG. 1 (*d*) is a cross sectional view showing the substrate in which the convex electrode 5 is formed. Finally, by removing the resist pattern 4, the substrate in which the convex electrode 5 is formed on the silicon wafer 1 can be obtained. FIG. 1 (*e*) is a cross sectional view showing the substrate having the thus obtained convex electrode. Here, as the convex electrode 5, generally, a material such as gold, silver, copper, nickel, and solder is used.

Figure 2:
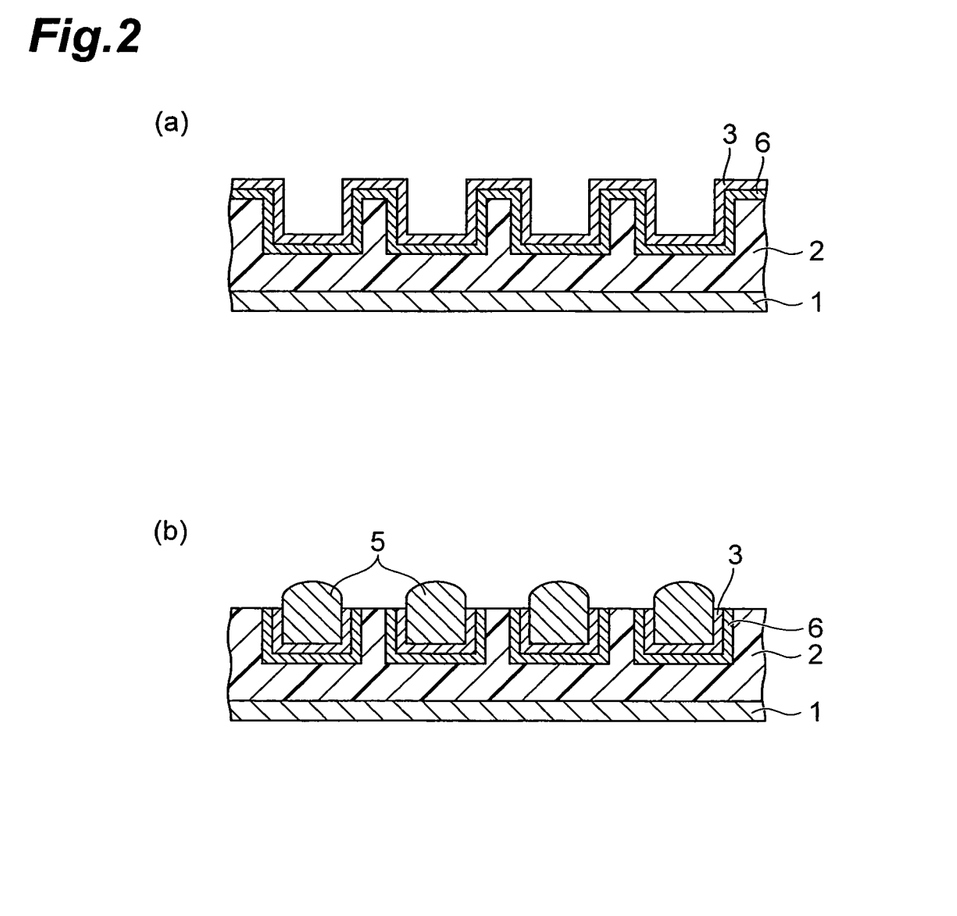
FIG. 2 is a cross sectional view showing a second embodiment of a production method of a substrate having a convex electrode.

FIG. 2 is a cross sectional view showing a second embodiment of a production method of a substrate having a convex electrode and also to a part of a step of this production method, the above-described polishing method is applied. However, FIG. 2 shows only the substrate before applying the polishing method (FIG. 2 (*a*)) and the finally obtained substrate having a convex electrode (FIG. 2 (*b*)) and each step therebetween of CMP polishing, resist pattern forming, convex electrode forming, and resist pattern removing is performed in the same manner as in the first embodiment.

The substrate shown in FIG. 2 (*a*) contains a silicon wafer 1, an insulating film 2 having a concavity-convexity formed on the silicon wafer 1, a underlying metal film 6 coating the concavity-convexity surface of the insulating film 2, and an under barrier metal layer 3 formed on the underlying metal film 6. Here, the under barrier metal layer 3 corresponds to a palladium layer. The formation of the underlying metal film 6 is performed for the object of suppressing the diffusion of components of the under barrier metal layer 3 to the silicon wafer 1 and enhancing the adhesion between the under barrier metal layer 3 and the silicon wafer 1.

The under barrier metal layer 3 and the underlying metal film 6 of such a substrate are polished using the CMP polishing liquid of the present invention. In other words, while supplying the CMP polishing liquid containing 1,2,4-triazole, a phosphoric acid, an oxidant, and abrasive particles between the under barrier metal layer 3 and a polishing cloth, the substrate is polished with a polishing cloth to expose a convexity of the insulating film 2. By such a polishing, the under barrier metal layer 3 and the underlying metal film 6 formed on the convexity of the insulating film 2 are removed. Then, by performing resist pattern forming, convex electrode forming, and resist pattern removing relative to the thus obtained substrate in the same manner as in the first embodiment, there can be obtained the substrate shown in FIG. 2 (*b*) in which the convex electrode 5 is formed on the silicon wafer 1.

Figure 3:
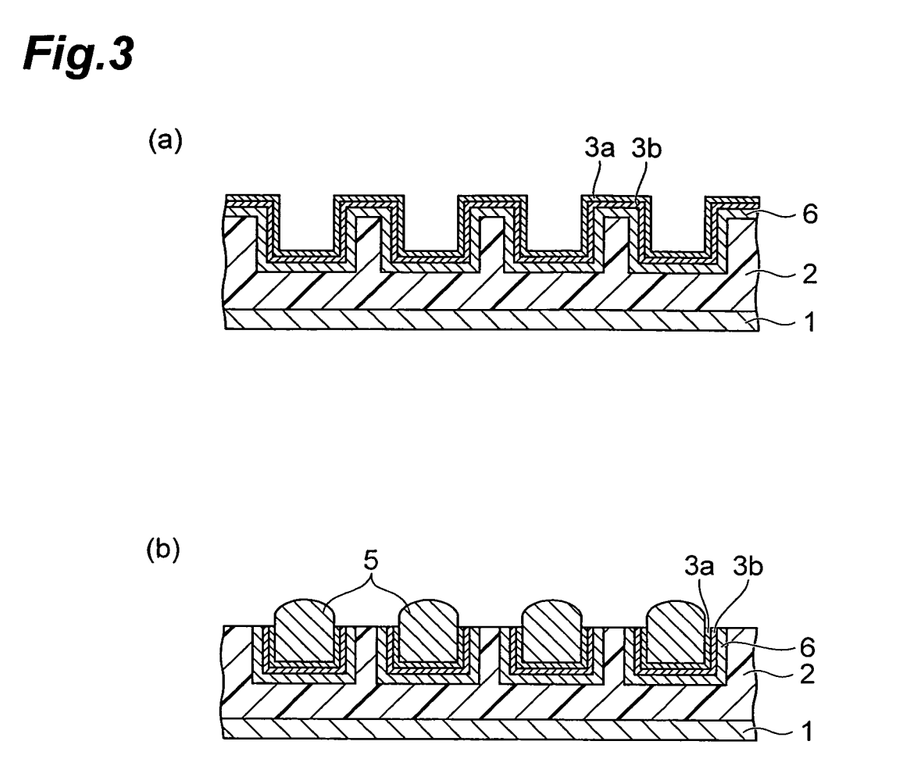
FIG. 3 is a cross sectional view showing a third embodiment of a production method of a substrate having a convex electrode.

FIG. 3 is a cross sectional view showing a third embodiment of a production method of a substrate having a convex electrode and also to a part of a step of this production method, the above-described polishing method is applied. However, FIG. 3 shows only the substrate before applying the polishing method (FIG. 3 (*a*)) and the finally obtained substrate having a convex electrode (FIG. 3 (*b*)) and each step therebetween of CPM polishing, resist pattern forming, convex electrode forming, and resist pattern removing is performed in the same manner as in the first embodiment.

The substrate shown in FIG. 3 (*a*) contains a silicon wafer 1, an insulating film 2 having a concavity-convexity formed on the silicon wafer 1, a underlying metal film 6 coating the concavity-convexity surface of the insulating film 2, a primary under barrier metal layer 3*b* formed on the underlying metal film 6, and a secondary under barrier metal layer 3*a* formed on the primary under barrier metal layer 3.*b*. Here, the primary under barrier metal layer 3*b* or the secondary under barrier metal layer 3*a* corresponds to a palladium layer.

The primary under barrier metal layer 3*b*, the secondary under barrier metal layer 3*a*, and the underlying metal film 6 of such a substrate are polished using the CMP polishing liquid of the present invention. In other words, while supplying the CMP polishing liquid containing 1,2,4-triazole, a phosphoric acid, an oxidant, and abrasive particles between the secondary under barrier metal layer 3*a* and a polishing cloth, the substrate is polished with a polishing cloth to expose a convexity of the insulating film 2. By such a polishing, the primary under barrier metal layer 3*b*, the secondary under barrier metal layer 3*a*, and the underlying metal film 6 formed on the convexity of the insulating film 2 are removed. Then, by performing resist pattern forming, convex electrode forming, and resist pattern removing relative to the thus obtained substrate in the same manner as in the first embodiment, there can be obtained the substrate shown in FIG. 3 (*b*) in which the convex electrode 5 is formed on the silicon wafer 1.

Figure 4:
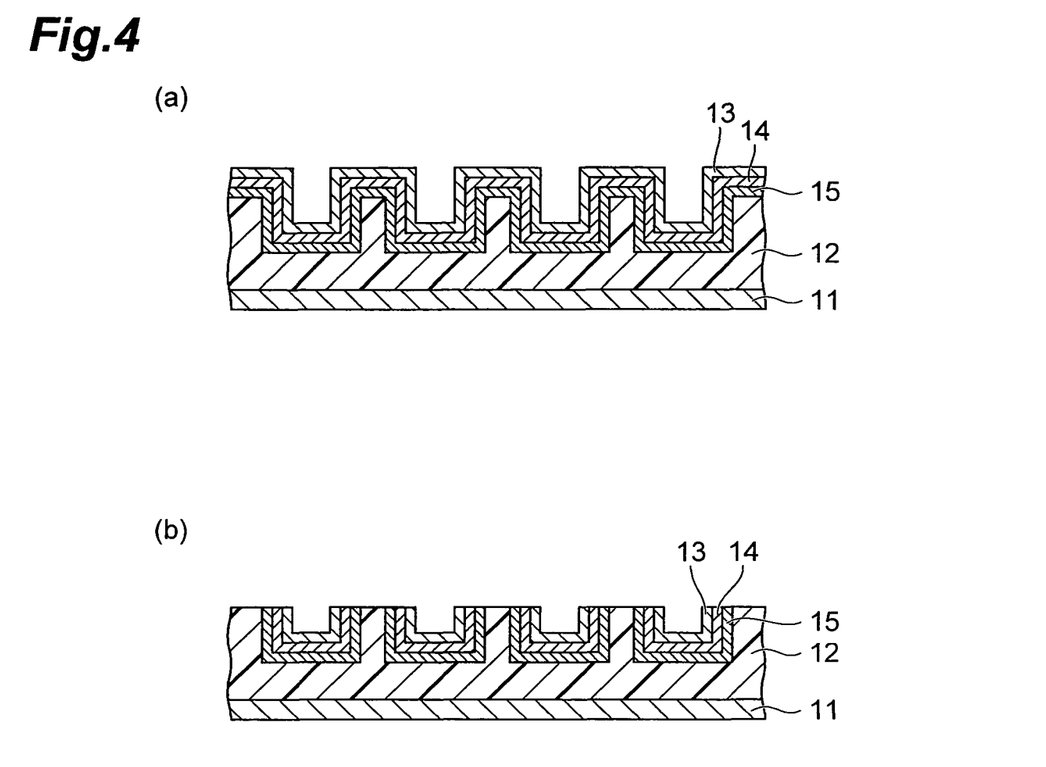
FIG. 4 is a cross sectional view showing a specific example of a third embodiment.

An example in which the primary under barrier metal layer and the secondary barrier metal layer in FIG. 3 are formed as a nickel layer and a palladium layer respectively (the under barrier metal has a structure composed of two layers) is shown in FIG. 4.

The substrate shown in FIG. 4 (a) is prepared by forming a underlying metal layer 15, a nickel layer 14, and a palladium layer 13 in this order on a concavity-convexity of an insulating film 12 provided on a silicon substrate 11. By polishing the palladium layer 13, the nickel layer 14, and the underlying metal layer 15 using the CMP polishing liquid of the present invention, the convexity of the insulating film 12 can be exposed as shown in FIG. 4 (b).

Other examples of the polishing method using the CMP polishing liquid include a polishing method including: a first polishing step of polishing the palladium layer 13 existing on the convexity of the insulating film 12 to expose the nickel layer 14; and a second polishing step of polishing the nickel layer 14, the underlying metal layer 15, and a portion of the palladium layer 13 filling the concavity of the insulating film 12, those existing on the convexity of the insulating film layer 1 to expose the convexity of the insulating film, in which in at least the first polishing step among the two polishing steps, the CMP polishing liquid is used.

EXAMPLE

Hereinafter, the present invention will be described referring to Examples which should not be construed as limiting the scope of the present invention.

(Preparing Method of Polishing Liquid)

The polishing liquids for CMP used in Examples 1 to 5 and Comparative Examples 1 to 16 were prepared containing 10% by mass of abrasive particles shown in Table 1, 10% by mass of 30% hydrogen peroxide water, 0.5 to 5% by mass of a metal oxide dissolving agent shown in Table 1, 0 to 0.5% by mass of a metal anticorrosive shown in Table 1, and the remainder of pure water, based on the mass of the polishing liquid. Using these polishing liquids for a metal, polishing of a substrate was performed under the below-described polishing conditions.

(Evaluation of Liquid State Property)

Measuring temperature: 25±5° C.

pH: measured by model number PHL-40 manufactured by DKK Corporation (Denki Kagaku Keiki Kabushiki Kaisha).

(Conditions for CMP Polishing)

Polishing apparatus: tabletop wrapping apparatus (manufactured by Nano Factor Co., Ltd.)

Polishing liquid flow rate: 11 mL/min.

Substrate: a silicon substrate on which a palladium film having a thickness of 0.3 μm was formed by a sputtering method.

Polishing pad: foamed polyurethane resin having a closed cell (manufactured by Rohm & Haas Japan, Co., Ltd.; model number: IC1000)

Polishing pressure: 29.4 kPa

Relative speed between substrate and polishing board: 25 m/min.

Supplying amount of polishing liquid: 11 mL/min.

Polishing time: 1 minute

Washing: the polished wafer was well-washed in running water, water drops were removed, and the wafer was dried.

(Evaluation Items for Polished Product)

Polishing rate: the polishing rate of a palladium film polished and washed under the above-described conditions was measured from the difference in the film thickness between before and after polishing converted from the electric resistance value.

The palladium polishing rates (PdRR) in Examples 1 to 5 and Comparative Examples 1 to 16 are shown in Table 1.

TABLE 1

|  | Abrasive particle (% by mass) | Metal oxide dissolving agent (% by mass) | Metal anticorrosive (% by mass) | pH | PdRR (nm/min.) |
|---|---|---|---|---|---|
| Example 1 | α-alumina (10) | Phosphoric acid (5) | 1,2,4-triazole (0.5) | 1.5 | 67 |
| Example 2 | Colloidal silica (10) | Phosphoric acid (5) | 1,2,4-triazole (0.5) | 1.5 | 40 |
| Example 3 | Colloidal silica (2) | Phosphoric acid (1) | 1,2,4-triazole (0.5) | 2.5 | 36 |
| Example 4 | Colloidal silica (2) | Polyphosphoric acid (1) | 1,2,4-triazole (0.5) | 1.9 | 34 |
| Example 5 | Colloidal silica (2) | Pyrophosphoric acid (1) | 1,2,4-triazole (0.5) | 1.9 | 31 |
| Comparative Example 1 | Colloidal silica (10) | Nitric acid (0.5) | — | 1.3 | 0.4 |
| Comparative Example 2 | Colloidal silica (10) | Glycolic acid (5) | — | 2 | 1.6 |
| Comparative Example 3 | Colloidal silica (10) | Oxalic acid (5) | — | 1.1 | 2.2 |
| Comparative Example 4 | Colloidal silica (10) | Phosphoric acid (5) | — | 1.4 | 4.4 |
| Comparative Example 5 | Colloidal silica (10) | — | 1,2,4-triazole (0.5) | 6.5 | 0.2 |
| Comparative Example 6 | Colloidal silica (10) | Glycolic acid (5) | 1,2,4-triazole (0.5) | 2.5 | 1.8 |
| Comparative Example 7 | Colloidal silica (10) | Phosphoric acid (5) | Imidazole (0.5) | 1.6 | 3.5 |
| Comparative Example 8 | Colloidal silica (10) | Phosphoric acid (5) | 1,2,3-triazole (0.5) | 1.5 | 0 |
| Comparative Example 9 | Colloidal silica (10) | Phosphoric acid (5) | Tetrazole (0.5) | 1.6 | 1.2 |

TABLE 1-continued

| | Abrasive particle (% by mass) | Metal oxide dissolving agent (% by mass) | Metal anticorrosive (% by mass) | pH | PdRR (nm/min.) |
|---|---|---|---|---|---|
| Comparative Example 10 | Colloidal silica (10) | Phosphoric acid (5) | 3-amino-1,2,4-triazole (0.5) | 2.1 | 3.1 |
| Comparative Example 11 | Colloidal silica (10) | Phosphoric acid (5) | 3,5-diamino-1,2,4-triazole (0.5) | 1.9 | 4 |
| Comparative Example 12 | Colloidal silica (10) | Phosphoric acid (5) | 3-carboxymethyl-1,2,4-triazole (0.5) | 1.7 | 0 |
| Comparative Example 13 | Colloidal silica (10) | Phosphoric acid (5) | 5-ethyl ester-1,2,4-triazole (0.5) | 1.7 | 0.2 |
| Comparative Example 14 | Colloidal silica (10) | Phosphoric acid (5) | Histidine (0.5) | 2.3 | 7.8 |
| Comparative Example 15 | Colloidal silica (10) | Phosphoric acid (5) | Guanidine (0.5) | 2.2 | 8.2 |
| Comparative Example 16 | Colloidal silica (10) | Phosphoric acid (5) | Glycylglycine (0.5) | 1.8 | 1.7 |

Hereinafter, the results shown in Table 1 will be described in detail. In Example 1, the same oxidant and the same metal oxide dissolving agent as those in Comparative Examples 4 and 7 to 16 were added and further, 0.5% by mass of 1,2,4-triazole as a complexing agent and 10% by mass of α-alumina having a secondary particle diameter of 0.3 µm as an abrasive particle were added. The oxidant is hydrogen peroxide water and the metal oxide dissolving agent is phosphoric acid. In Example 1, the palladium polishing rate exhibited 67 nm/min. which is a value higher than that in Comparative Examples 4 and 7 to 16.

In Example 2, the same oxidant and the same metal oxide dissolving agent as those in Comparative Examples 4 and 7 to 16 were added and further, 0.5% by mass of 1,2,4-triazole as a complexing agent and 10% by mass of colloidal silica having a secondary particle diameter of 42 nm as an abrasive particle were added. The oxidant is hydrogen peroxide water and the metal oxide dissolving agent is phosphoric acid. In Example 2, the palladium polishing rate exhibited 40 nm/min. which is a value higher than that in Comparative Examples 4 and 7 to 16.

In Example 3, the same oxidant and the same metal oxide dissolving agent as those in Comparative Examples 4 and 7 to 16 were added and further, 0.5% by mass of 1,2,4-triazole as a complexing agent and 2% by mass of colloidal silica having a secondary particle diameter of 42 nm as an abrasive particle were added. The oxidant is hydrogen peroxide water, the metal oxide dissolving agent is phosphoric acid, and the added amount of phosphoric acid is 1% by mass. In Example 3, the palladium polishing rate exhibited 36 nm/min. which is a value higher than that in Comparative Examples 4 and 7 to 16.

In Example 4, the same oxidant as that in Comparative Examples 1 to 16 was added and further, 0.5% by mass of 1,2,4-triazole as a complexing agent, 1% by mass of polyphosphoric acid as a metal oxide dissolving agent, and 2% by mass of colloidal silica having a secondary particle diameter of 42 nm as an abrasive particle were added. The oxidant is hydrogen peroxide water. In Example 4, the palladium polishing rate exhibited 34 nm/min. which is a value higher than that in Comparative Examples 1 to 16.

In Example 5, the same oxidant as that in Comparative Examples 1 to 16 was added and further, 0.5% by mass of 1,2,4-triazole as a complexing agent, 1% by mass of pyrophosphoric acid as a metal oxide dissolving agent, and 2% by mass of colloidal silica having a secondary particle diameter of 42 nm as an abrasive particle were added. The oxidant is hydrogen peroxide water. In Example 5, the palladium polishing rate exhibited 31 nm/min. which is a value higher than that in Comparative Examples 1 to 16.

INDUSTRIAL APPLICABILITY

By the CMP polishing liquid of the present invention and the polishing method using the CMP polishing liquid, the polishing rate of at least a palladium layer can be enhanced higher than that in the case of using a conventional polishing liquid and polishing can be performed at a desired polishing rate.

REFERENCE SIGNS LIST

1 . . . silicon wafer, 2, 12 . . . insulating film, 3 . . . under barrier metal layer, 3a . . . secondary under barrier metal layer, 3b . . . primary under barrier metal layer, 4 . . . resist pattern, 5 . . . convex electrode, 6, 15 . . . underlying metal layer, 11 . . . silicon substrate, 13 . . . palladium layer, 14 . . . nickel layer.

The invention claimed is:

1. A substrate polishing method, comprising:
preparing a substrate comprising a palladium layer; and
removing at least a portion of the palladium layer by polishing the substrate with a polishing cloth while supplying a CMP polishing liquid between the substrate and the polishing cloth, wherein
the CMP polishing liquid comprises 0.05-10 mass % of 1,2,4-triazole, 0.02-20 mass % of phosphoric acids, 0.05-20 mass % of hydrogen peroxide, and abrasive particles, the abrasive particles comprise colloidal silica, and
a pH of the CMP polishing liquid is 1-4.

2. The polishing method according to claim 1, wherein a concentration of the abrasive particles is 0.1 to 10% by mass, based on the total mass of the CMP polishing liquid.

3. The substrate polishing method according to claim 1 wherein the phosphoric acids consist of phosphoric acid, and the abrasive particles consist of colloidal silica.

4. The substrate polishing method according to claim 1 wherein the substrate comprises an insulating film and the palladium layer.

5. The substrate polishing method according to claim 1 wherein the substrate comprises an underlying metal layer and the palladium layer; and
the removing at least a portion of the palladium layer removes at least a portion of the underlying metal layer and a portion of the palladium layer.

6. The substrate polishing method according to claim 1 wherein the substrate comprises an insulating film, a primary under barrier metal layer and a secondary under barrier metal layer, wherein either one of the primary under barrier metal layer or the secondary under barrier metal layer consists of the palladium layer; and the removing at least a portion of the palladium layer removes at least a portion of the primary under barrier metal layer and a portion of the secondary under barrier metal layer.

7. The substrate polishing method according to claim 6 wherein either one of the primary under barrier metal layer or the secondary under barrier metal layer consists of the palladium layer and the other under barrier metal layer consists of a nickel layer.

8. The substrate polishing method according to claim 1 wherein the substrate comprises an insulating film, an underlying metal layer, a primary under barrier metal layer and a secondary under barrier metal layer, wherein either one of the primary under barrier metal layer or the secondary under barrier metal layer consists of the palladium layer; and the removing at least a portion of the palladium layer removes at least a portion of the underlying metal layer, a portion of the primary under barrier metal layer and a portion of the secondary under barrier metal layer.

9. The polishing method according to claim 8, wherein either one of the primary under barrier metal layer or the secondary under barrier metal layer consists of the palladium layer and the other under barrier metal layer consists of a nickel layer.

* * * * *